(12) United States Patent
Pedersen et al.

(10) Patent No.: US 6,653,642 B2
(45) Date of Patent: Nov. 25, 2003

(54) METHODS AND APPARATUS FOR OPERATING HIGH ENERGY ACCELERATOR IN LOW ENERGY MODE

(75) Inventors: Bjorn O. Pedersen, Chelmsford, MA (US); Peter E. Maciejowski, Amesbury, MA (US); William G. Goodenough, Exeter, NH (US); Paul J. Murphy, Reading, MA (US); Charles M. McKenna, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 410 days.

(21) Appl. No.: 09/779,243

(22) Filed: Feb. 8, 2001

(65) Prior Publication Data

US 2001/0040220 A1 Nov. 15, 2001

Related U.S. Application Data

(60) Provisional application No. 60/182,079, filed on Feb. 11, 2000.

(51) Int. Cl.[7] .......................... H01J 37/317; H05H 5/06
(52) U.S. Cl. .............................. 250/492.21; 250/492.1; 315/500; 315/506; 315/5.41; 315/5.39
(58) Field of Search .................... 250/492.21, 492.1; 315/5.41, 5.39, 500, 506

(56) References Cited

U.S. PATENT DOCUMENTS

| | | | |
|---|---|---|---|
| 4,015,191 A | * | 3/1977 | Okumura .................... 323/282 |
| 4,383,180 A | | 5/1983 | Turner |
| 4,667,111 A | | 5/1987 | Glavish et al. |
| 4,703,234 A | * | 10/1987 | Kato .......................... 315/5.41 |
| 4,814,716 A | | 3/1989 | Kato et al. |
| 5,300,891 A | | 4/1994 | Tokoro |
| 5,767,522 A | | 6/1998 | Kodama |
| 5,801,488 A | | 9/1998 | Fujisawa |

* cited by examiner

*Primary Examiner*—Nikita Wells

(57) ABSTRACT

Methods and apparatus are provided for efficiently operating an ion implanter which includes a charged particle accelerator in a high energy mode and in a low energy mode. The charged particle accelerator includes a high voltage power supply, an accelerator column coupled to the high voltage power supply and a switching assembly. The accelerator column includes a plurality of accelerator electrodes. The high voltage power supply is disabled from energizing the accelerator column in the low energy mode. The switching assembly includes switching elements for electrically connecting the accelerator electrodes to a reference potential in the low energy mode and for electrically isolating the accelerator electrodes from the reference potential in the high energy mode. The switching assembly prevents positive potentials on the accelerator electrodes and thus minimizes space charge expansion of the beam when transporting positive ion beams in the low energy mode.

31 Claims, 12 Drawing Sheets

METHODS AND APPARATUS FOR OPERATING HIGH ENERGY ACCELERATOR IN LOW ENERGY MODE

CROSS REFERENCE TO RELATED APPLICATION

This application claims the benefit of provisional application Ser. No. 60/182,079, filed Feb. 11, 2000, which is hereby incorporated by reference.

FIELD OF THE INVENTION

The present invention relates to charged particle accelerators and, more particularly, to methods and apparatus for operating high energy accelerators in a low energy mode.

BACKGROUND OF THE INVENTION

Ion implantation is a standard, commercially accepted technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Exacting requirements are placed on semiconductor fabrication processes involving ion implantation with respect to the cumulative ion dose implanted into the wafer, implant depth, dose uniformity across the wafer surface, surface damage and undesirable contamination. The implanted dose and depth determine the electrical activity of the implanted region, while dose uniformity is required to ensure that all devices on the semiconductor wafer have operating characteristics within specified limits.

To form devices on the semiconductor wafer, it is usually necessary to implant impurities at different depths. The energy of the particles in the beam is determinative of the depth to which the particles penetrate into the semiconductor wafer. As devices are reduced in size and increased in speed, it has become desirable to use very low energy beams to form, for example, shallow transistor junctions in the semiconductor wafer.

Ion implantation with a low energy ion beam is not a trivial task, however. The ions within the beam are typically positively charged particles. Electrostatic repulsion of the charged particles causes the beam to diverge, particularly at low energies where the low velocities of the individual particles dictate that the particles remain within the beam for a comparatively longer period of time before reaching the target wafer.

Since a given "recipe" for fabricating an electronic device on a semiconductor wafer may call for implantation steps at both high and low energies, it may be desirable to control the ion implanter to implant ions over a wide range of implant energies. This avoids the time, additional cost and potential wafer contamination associated with ion implantation in different ion implanters adapted for different energy ranges.

A high energy ion implanter may employ a so-called tandem accelerator which receives a low energy ion beam with energy on the order of a few tens of keV (thousand electron volts) and further accelerates the ion beam to energies in the range of several hundred to several thousand keV. A tandem accelerator typically includes a low energy accelerator tube, a terminal, and a high energy accelerator tube assembled to form an in-line structure known as an accelerator column. The accelerator tubes contain a number of accelerator electrodes separated by insulating rings. A high positive voltage is applied by a high voltage supply to the terminal and thereby to the highest voltage electrodes of the low energy and high energy accelerator tubes. Adjacent accelerator electrodes are interconnected by high value resistors which distribute the applied voltage among the accelerator electrodes. The terminal between the first and second accelerator tubes contains a gas-filled stripper tube which converts ions in the beam from a negative charge to a positive charge. In a normal high energy mode, a negative ion beam is injected into the tandem accelerator, is accelerated through the low energy accelerator tube to the terminal, is converted to a positive beam and then is accelerated further in the high energy accelerator tube.

To produce beams at low energy, it is desirable to inject a positive ion beam into the tandem accelerator and to turn the high voltage power supply off. However, stray potentials may remain on the accelerator electrodes after the high energy accelerator is deactivated. Furthermore, the fringes of the low energy ion beam may strike the accelerator electrodes and cause the electrodes to develop a positive voltage. The resistors connected between accelerator electrodes, typically on the order of 100 megohms, are insufficient to discharge the electrodes during low energy operation. The accelerator electrodes are located in a high voltage tank that is pressurized with $SF_6$ gas and are not accessible during operation. The result is that the positive voltages on the accelerator electrodes may remove free electrons from the ion beam during low energy operation. Electrons that travel with the positive ions in the ion beam have the beneficial effect of reducing the tendency for space charge expansion of the ion beam. Thus, positive voltages on the accelerator electrodes during low energy operation exacerbate space charge expansion of the ion beam and reduce the beam current transported through the accelerator.

Accordingly, there is a need for methods and apparatus for operating high energy accelerators in a low energy mode.

SUMMARY OF THE INVENTION

The present invention provides an ion implanter capable of operating both at high energy and at low energy and enables efficient low energy operation. A switch assembly is configured to connect accelerator electrodes of a high energy accelerator to a selected potential, such as ground or a suitable negative potential, to remove from the accelerator electrodes stray voltages that may otherwise adversely affect the ion beam.

According to one aspect of the invention, a charged particle accelerator that is operable in a high energy mode and in a low energy mode is provided. The charged particle accelerator comprises a high voltage power supply for generating a high voltage, an accelerator column coupled to the high voltage power supply and a switching assembly. The accelerator column comprises a plurality of accelerator electrodes having apertures for transport of a charged particle beam and resistors coupled between adjacent ones of the accelerator electrodes for distributing the high voltage among the accelerator electrodes. The high voltage power supply is disabled from energizing the accelerator column in the low energy mode. The switching assembly comprises one or more switching elements for electrically connecting the accelerator electrodes to a reference potential in the low energy mode and for electrically isolating the accelerator electrodes from the reference potential in the high energy mode.

In one embodiment, each of the switching elements comprises a flexible conductor having a first portion affixed to one of the accelerator electrodes and a second portion that is movable between a high energy position in electrical contact with the same accelerator electrode and a low energy position in electrical contact with an adjacent accelerator electrode. The flexible conductors may comprise conductive strips. In another embodiment, the flexible conductors comprise conductive wires formed into elongated loops. The switching assembly may further comprise an actuator for moving the flexible conductors between the high energy position and the low energy position, and an actuation rod coupled between the actuator and each of the flexible conductors.

In one embodiment, the switching assembly comprises switching elements that are respectively connected directly to the accelerator electrodes. In another embodiment, the switching assembly comprises a stack of electrically isolated conductive plates respectively connected to the accelerator electrodes, and each of the switching elements comprises a first portion affixed to one of the conductive plates and a second portion that is movable between a high energy position in electrical contact with the same conductive plate and a low energy position in electrical contact with an adjacent conductive plate.

In a further embodiment, the switching elements comprise diodes respectively coupled to the accelerator electrodes. The diodes are reverse biased in the high energy mode and are forward biased to provide a conductive path to the reference potential in the low energy mode.

In another embodiment, the one or more switching elements comprise a conductive switching bar that is laterally movable between a low energy position in electrical contact with the accelerator electrodes and a high energy position spaced from the accelerator electrodes.

According to another aspect of the invention, a method is provided for operating a charged particle accelerator in a low energy mode. The charged particle accelerator comprises a high voltage power supply for generating a high voltage and an accelerator column coupled to the high voltage power supply. The accelerator column comprises a plurality of accelerator electrodes having apertures for transport of a charged particle beam and resistors coupled between adjacent ones of the accelerator electrodes for distributing the high voltage among the accelerator electrodes. The method comprises the steps of disabling the high voltage power supply from energizing the accelerator column in the low energy mode, and electrically connecting the accelerator electrodes to a reference potential in the low energy mode.

BRIEF DESCRIPTION OF THE DRAWINGS

For a better understanding of the present invention, reference is made to the accompanying drawings, which are incorporated herein by reference and in which.

DETAILED DESCRIPTION

An ion implanter in accordance with the present invention is capable of operating both at high energy in a high energy mode and at low energy in a low energy mode. In one aspect of the invention, efficient, low energy operation is achieved in a high energy implanter by providing an apparatus and method for connecting the accelerator electrodes of a high energy accelerator to a reference potential, such as ground or a negative voltage, in the low energy mode. By connecting the accelerator electrodes to a reference potential, positive potentials are removed from the accelerator electrodes, thus minimizing the likelihood that remaining stray potentials or charge deposited by the beam will adversely affect the ion beam during low energy implantation. In particular, a switching assembly is used to prevent uncontrolled accelerator electrode voltages which otherwise would remove free electrons from the ion beam and reduce beam transport through the ion implanter.

Figure 1:
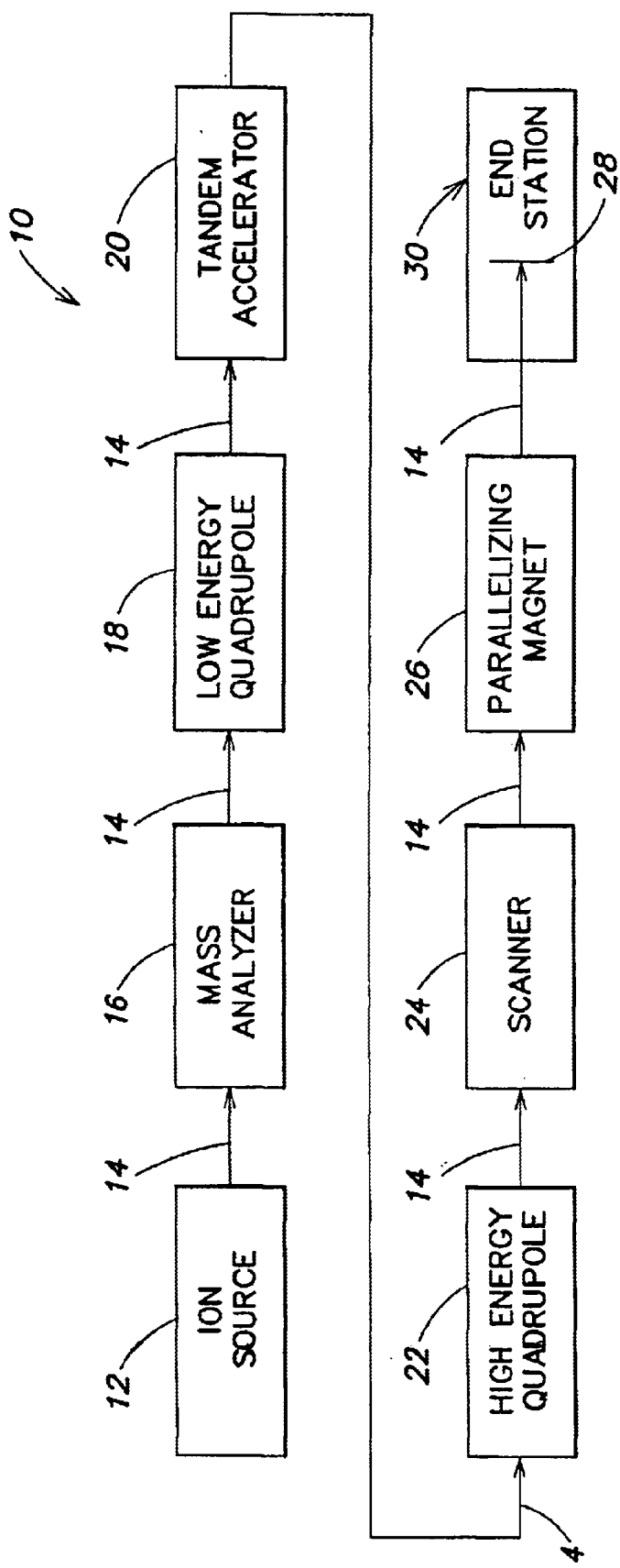
FIG. 1 is a functional block diagram of an ion implanter according to an embodiment of the invention.

As shown in FIG. 1, an ion implanter 10 includes an ion source 12. Ion source 12 ionizes atoms of a dopant material and forms an ion beam 14 having an energy of a few tens of keV. The beam may contain negative ions for high energy operation or positive ions for low energy operation. The ion beam at this stage may include multiple species, isotopes, and charge states produced from the dopant material. A particular isotope, species or charge state is selected by a mass analyzer 16. The beam 14 is then conditioned in a low energy quadrupole lens 18, which focuses the beam and centers it prior to entering a high energy charged particle accelerator 20. The accelerator 20 is discussed in detail below.

After the beam 14 leaves the accelerator 20, it is again conditioned by a high energy quadrupole lens 22, which focuses the beam 14 on the entrance to a scanner 24. The scanner 24 scans the beam 14 across the surface of a wafer 28 in an end station 30. A parallelizing magnet 26 is provided to ensure that the beam 14 is incident on the wafer 28 at a constant angle across the wafer surface.

Figure 2:
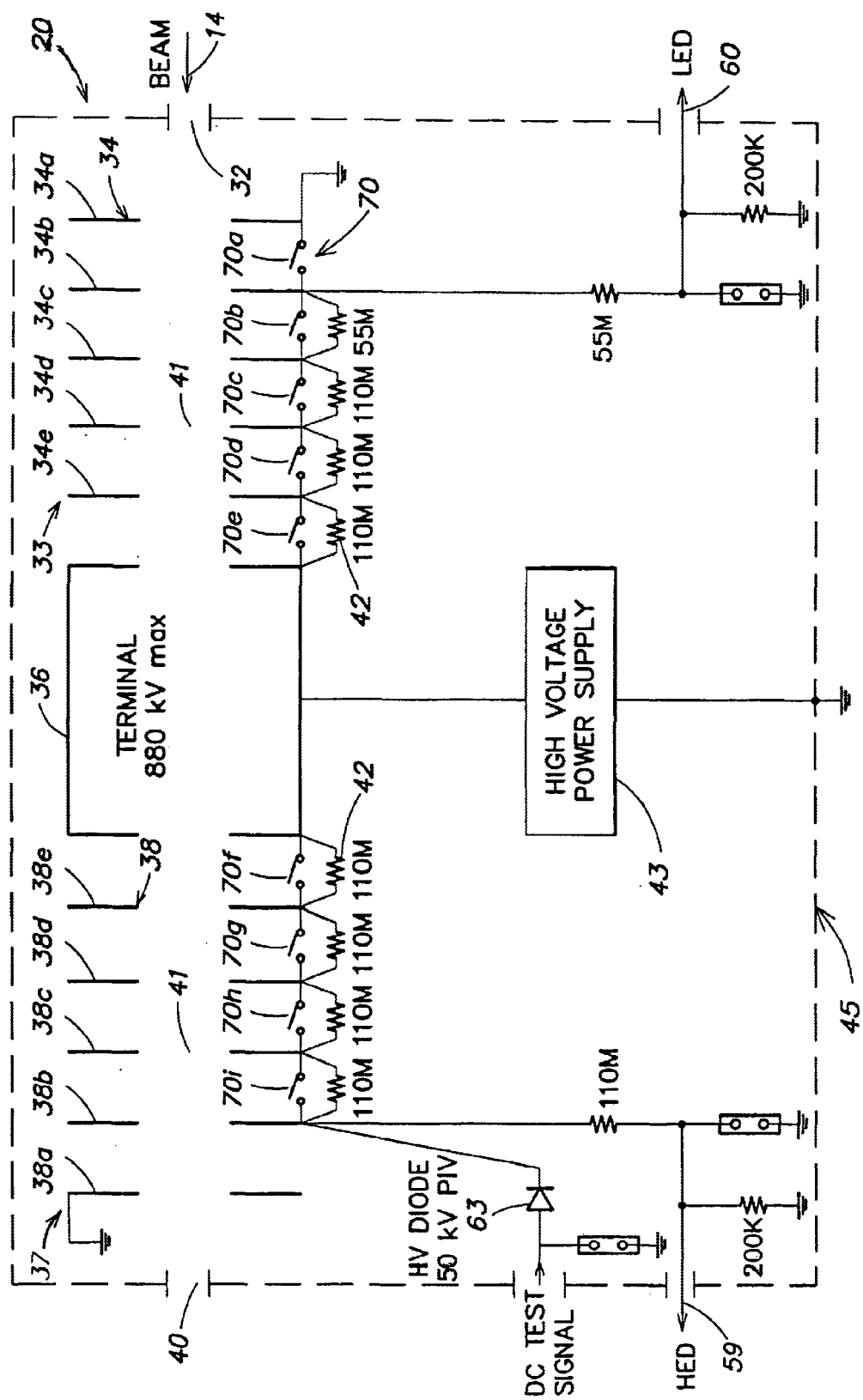
FIG. 2 is a schematic diagram of a tandem accelerator for use in the ion implanter of FIG. 1, including a switching assembly according to an embodiment of the invention.

The charged particle accelerator 20 may be a tandem accelerator 20 as illustrated schematically in FIG. 2. As shown in FIG. 2, the ion beam 14 enters the accelerator 20 at an entrance 32, passes a first, or low energy, accelerator tube 33 having accelerator electrodes 34, passes through a terminal 36, passes a second, or high energy, accelerator tube 37 having accelerator electrodes 38, and exits the accelerator 20 at an exit 40. The low energy accelerator tube 33, the terminal 36, and the high energy accelerator tube 37 constitute an accelerator column. It should be noted that the ion beam 14 is transported from left to right in FIG. 1 but is transported from right to left in FIG. 2. Accelerator electrodes 34, 36 are spaced-apart conductive plates having apertures 41 for transport of ion beam 14. In the example of FIG. 2, accelerator electrodes 34 include electrodes 34a, 34b, 34c, 34d and 34e, and accelerator electrodes 38 include electrodes 38a, 38b, 38c, 38d and 38e. In a practical implementation of the accelerator, a larger number of accelerator electrodes is typically used. In one example, each accelerator tube 33, 37 of the accelerator includes 24 accelerator electrodes. Adjacent accelerator electrodes are connected by high value resistors 42, such as 110 megaohm resistors.

The tandem accelerator 20 is designed for operation in a high energy mode where a high positive voltage, for example on the order of 880 kilovolts (kV), is applied to terminal 36 by a high voltage power supply 43. The high voltage applied to terminal 36 is distributed by resistors 42 among accelerator electrodes 34 and 38. In particular, where resistors 42 have equal values, the accelerator electrodes of accelerator tubes 33 and 37 have voltage gradients between the high voltage of terminal 36 and ground, with equal voltages between adjacent accelerator electrodes. The accelerator electrodes 34, 36, resistors 42 and terminal 36 may be mounted in a high voltage tank 45 that is pressurized with $SF_6$ gas to facilitate high voltage operation without arcing.

The terminal 36 includes a charge exchange device (not shown) that, by removal of electrons, converts a fraction of the negative ions in ion beam 14 to positive ions. The negative ions in beam 14 are accelerated by the low energy accelerator tube 33, and the ions which were converted in terminal 36 to positive ions are further accelerated by the high energy accelerator tube 37. The high voltage applied to terminal 36 is adjusted to accelerate ion beam 14 to a desired implant energy. Thus for example, if negative ions enter the accelerator with an energy of 50 keV and the terminal voltage is adjusted to 750 kV, positive ions in ion beam 14 with one electronic charge exit the accelerator with an energy of 1550 keV, having gained 1500 keV in the accelerator.

It is desirable to operate the ion implanter 10 of FIG. 1 in a low energy mode where high voltage power supply 43 is turned off. In particular, high voltage power supply 43 is turned off or is disconnected from accelerator tubes 33 and 37, so that the high voltage is not applied to accelerator electrodes 34, 38. However, in the low energy mode, stray voltages on the accelerator electrodes 34, 38 and terminal 36 may adversely affect the ion beam 14 by removing free electrons from the beam and, hence, causing the beam to expand due to increased intermolecular electrostatic repulsion.

Applicants discovered that these effects can be minimized by grounding the accelerator electrodes 34, 38 and terminal 36 of accelerator 20, or by applying a relatively small negative potential to the accelerator electrodes 34, 38 and terminal 36, when the implanter 10 is operated in the low energy mode. Preferably, a switching assembly electrically connects the accelerator electrodes to a reference potential in the low energy mode and electrically isolates the accelerator electrodes from the reference potential in the high energy mode. In the embodiment of FIG. 2, the switching assembly includes switching elements 70, including switching elements 70a–70d and 70g–70i connected between adjacent accelerator electrodes, and switching elements 70e and 70f connected between respective accelerator electrodes and terminal 36. The switching assembly also includes a switch actuator, not shown in FIG. 2 but described below, for operating switching elements 70 between open and closed states. When switching elements 70a–70i are closed, accelerator electrodes 34 and 38 and terminal 36 are connected to ground for operation in the low energy mode. When switching elements 70a–70i are open, the high voltage may be applied to electrodes 34 and 38 in the high energy mode.

Switching elements 70 may be implemented as mechanical switches or electronic switches. The switch actuator may be mechanical, electromechanical or electronic. Several specific embodiments of switching assemblies are described below. The invention is not limited to these particular embodiments, but rather extends to any apparatus suitable for connecting the accelerator electrodes 34, 38 and terminal 36 to a reference potential, such as ground or a negative voltage, in the low energy mode.

Figure 3:
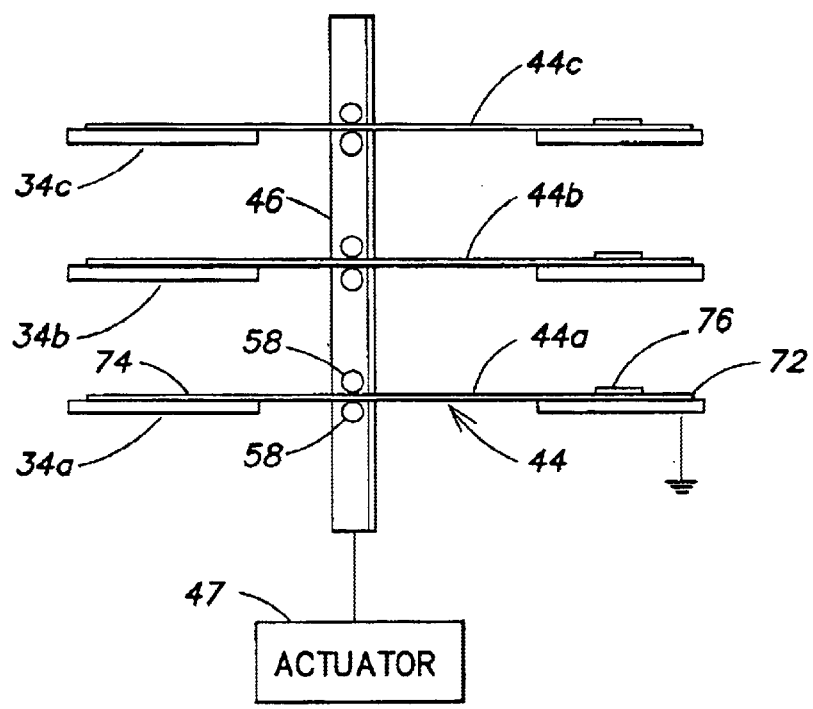
FIG. 3 is a partial cross-sectional side view of the accelerator of FIG. 2, illustrating a first embodiment of the switching assembly, including switching elements in contact with respective accelerator electrodes in the high energy mode.
Figure 4:
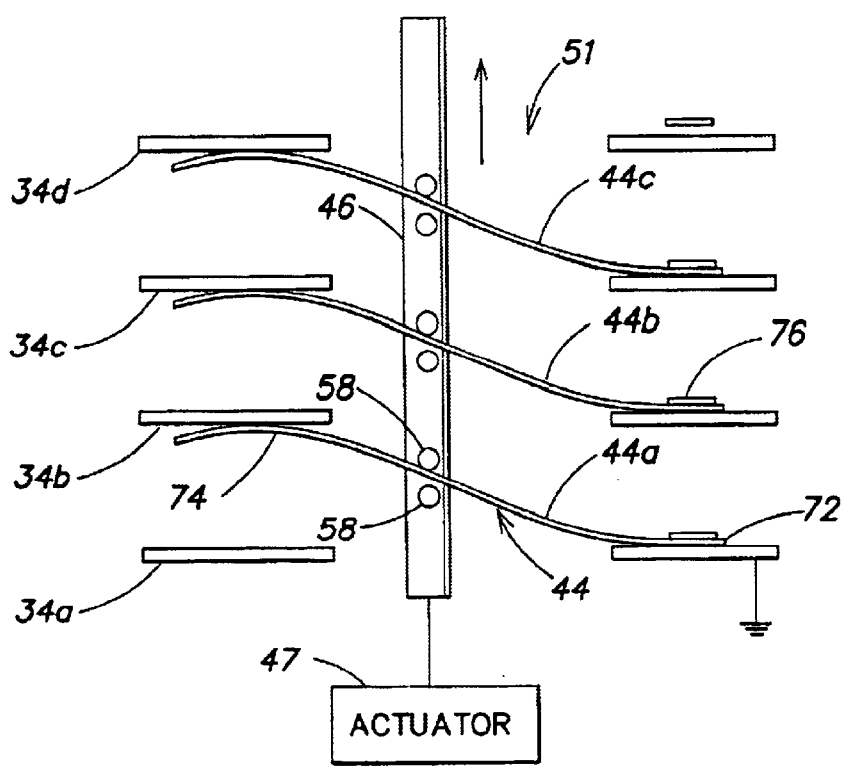
FIG. 4 is a partial cross-sectional side view of the accelerator of FIG. 2, illustrating the first embodiment of the switching assembly, including switching elements in contact with adjacent accelerator electrodes in the low energy mode.

A first embodiment of a switching assembly is described in connection with FIGS. 3–5. The switching assembly includes a flexible conductor 44 affixed to each accelerator electrode 34, 38, an actuator 47, and an actuation rod 46 connected between actuator 47 and flexible conductors 44. Flexible conductors 44a, 44b and 44c affixed to accelerator electrodes 34a, 34b and 34c, respectively, are shown in FIGS. 3 and 4. Each flexible conductor is affixed at a location 72 to one of the accelerator electrodes 34, 38. A portion 74 of each flexible conductor 44 is movable between a high energy position (FIG. 3), in which flexible conductor 44 is in contact with the accelerator electrode 34 to which it is attached at location 72, and a low energy position (FIG. 4), in which the flexible conductor 44 contacts both the accelerator electrode 34 to which it is attached and an adjacent accelerator electrode 34. Thus, for example, portion 74 of flexible conductor 44a is movable between a high energy position in contact with accelerator electrode 34a (FIG. 3) and a low energy position in contact with adjacent accelerator electrode 34b (FIG. 4). The actuator 47 and the actuation rod 46 move the flexible conductors 44 between the high energy position and the low energy position. It has been found that connecting the accelerator electrodes 34, 38 and terminal 36 to a reference potential eliminates stray potentials on elements of the accelerator and thus ensures that the stray potentials do not adversely affect the ion beam when the accelerator is operated in the low energy mode.

Each group of accelerator electrodes 34, 38 in tandem accelerator 20 may be provided with a separate actuation rod 46, each of which is independently actuated by a separate actuator 47. Alternatively, a single actuation rod 46 may be used to move the sets of flexible conductors 44 on accelerator electrodes 34 and 38. Using two actuation rods 46 may be desirable, for example, where the terminal 36 prevents one actuation rod 46 from being used to move the flexible conductors 44 on both sets of accelerator electrodes 34 and 38. The actuation rod 46 is an insulator in the embodiment of FIGS. 3–5.

The flexible conductors 44, in the high energy position, electrically isolate adjacent accelerator electrodes 34 and 38 and terminal 36. Preferably, the switching assembly is designed to minimize impact on operation in the high energy mode and, in particular, to minimize the risk of arcing when high voltages are applied to accelerator electrodes 34 and 38 and terminal 36. When it is desired to use the ion implanter 10 in the low energy mode, the application of high voltage to the accelerator stacks is disabled and accelerator electrodes 34, 38, and the terminal 36 are connected to the reference potential by the switching assembly. In the embodiment of FIGS. 3 and 4, adjacent electrodes may be connected to each other by energizing actuator 47 to move actuation rod 46 and to thereby move each flexible conductor 44 into contact with an adjacent accelerator electrode. This, in effect, short circuits each resistor 42 (FIG. 2) to place each of accelerator electrodes 34, 38 and the terminal 36 at the same potential as the last accelerator electrode. Thus, in one embodiment, if the last accelerator electrode is connected to ground, all accelerator electrodes are connected to ground. Alternatively, if the last accelerator electrode is connected to a negative potential, all accelerator electrodes 34, 38 and the terminal 36 are connected to that potential. As shown in FIG. 2, accelerator electrode 34a is connected to ground. Thus, when switching elements 70a–70i are closed (in a conducting state), all accelerator electrodes 34, 38 and terminal 36 are connected to ground.

Each of the flexible conductors 44 may be attached at location 72 to its respective electrode 34, 38 or terminal 36 using any suitable device, such as a bolt 76 or welding. Portion 74 of each of the flexible conductors 44 is movable to enable the flexible conductors 44 to contact adjacent accelerator electrodes 34, 38 and terminal 36.

Figure 5:
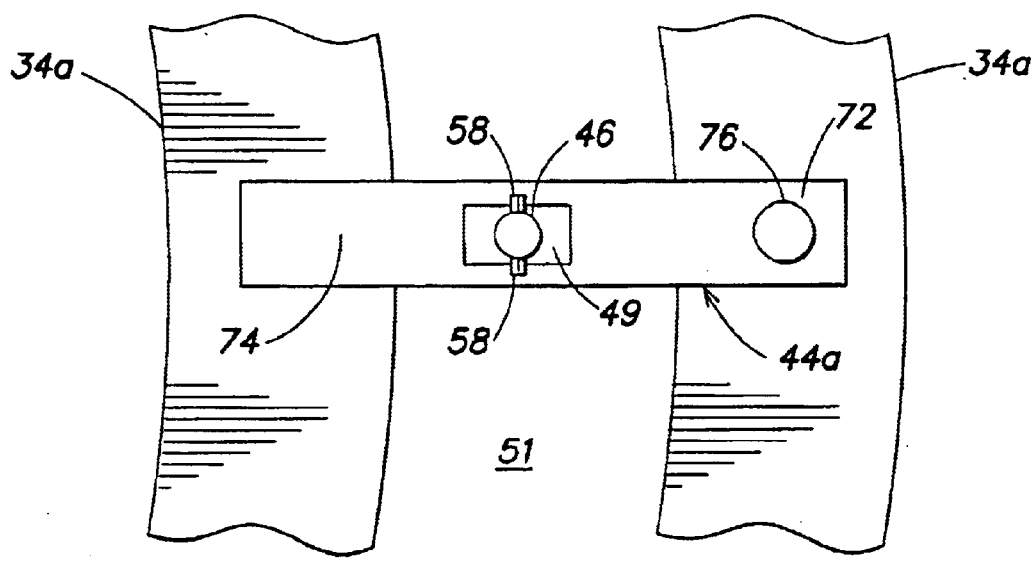
FIG. 5 is an end view of the switching assembly shown in FIGS. 3 and 4.

As shown in FIG. 5, the actuation rod 46 may pass through a hole 49 in each flexible conductor 44. The hole 49, in this embodiment, is elongated to enable the actuation rod 46 to remain on a given axis as the flexible conductors 44 are moved from the high energy position to the low energy position. An aperture 51 may be provided in each of the accelerator electrodes 34, 38 to accommodate actuation rod 46. Alternatively, the actuator rod may pass outside the periphery of the accelerator electrodes 34, 38 and terminal 36.

The flexible conductors 44 may be formed as thin strips of beryllium copper (BeCu) or other suitable conductive material. Preferably, the flexible conductors are formed of resilient conductive material capable of lying flat against the accelerator electrode in the high energy mode, to avoid inadvertently shorting the accelerator stack or causing a discharge between adjacent accelerator electrodes.

Figure 6:
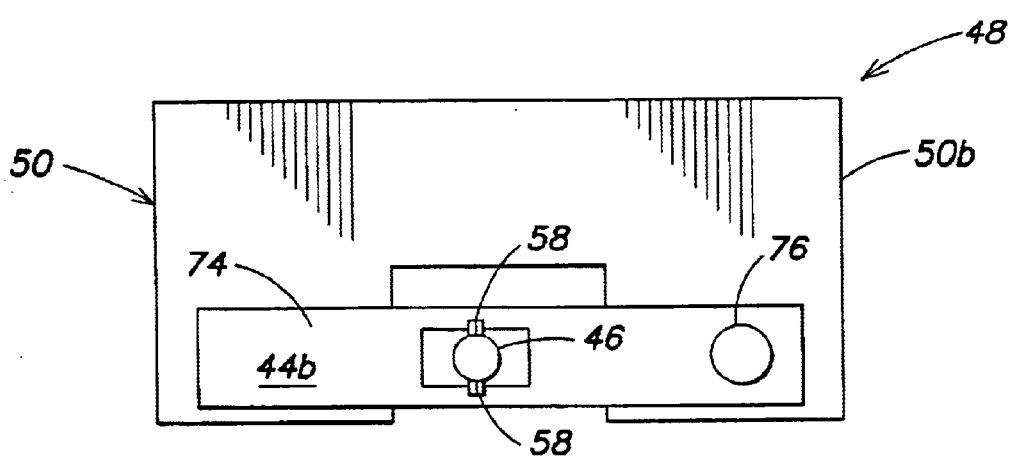
FIG. 6 is an end view of a self-contained switching assembly according to a second embodiment of the invention.
Figure 7:
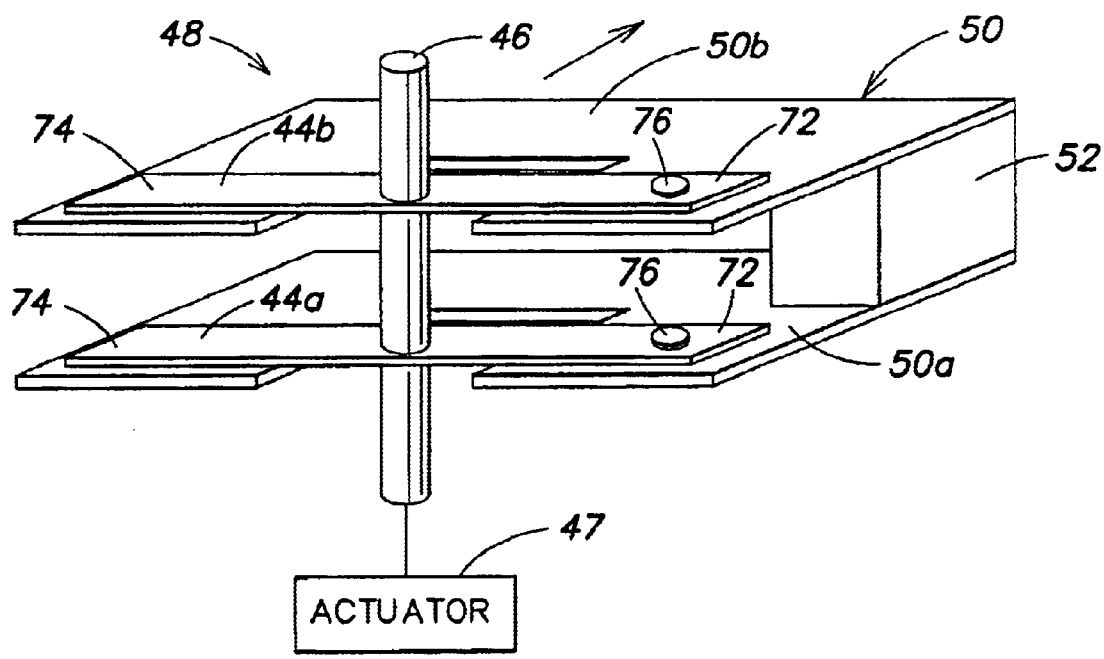
FIG. 7 is a partial perspective view of the self-contained switching assembly shown in FIG. 6.

The embodiment of the switching assembly shown in FIGS. 3–5 and described above includes flexible conductors 44 attached directly to accelerator electrodes 34 and 38. In another embodiment, shown in FIGS. 6 and 7, the switching assembly is a self-contained unit. A self-contained switching assembly 48 shown in FIGS. 6 and 7 includes a stack of electrically isolated conductive plates 50, flexible conductors 44 attached at location 72 to respective plates 50, actuation rod 46 and actuator 47. In the example of FIG. 7, the stack of conductive plates 50 includes plates 50a and 50b having flexible conductors 44a and 44b, respectively attached thereto. In an actual implementation, one plate 50 corresponds to each accelerator electrode in the accelerator. Thus, in the embodiment of FIG. 2, one plate 50 corresponds to each of accelerator electrodes 34a–34e and 38a–38e. Plates 50 may be spaced apart by one or more blocks 52 of insulating material. Each of plates 50 is electrically connected to one of the accelerator electrodes. Preferably, plates 50 have the same spacing as the respective accelerator electrodes to which they are connected. Each flexible conductor 44 is connected at location 72 to one of plates 50, and portion 74 is free to be moved into contact with an adjacent plate by movement of actuation rod 46. Because of its modular nature, the self-contained switch assembly may be useful, for example, to retrofit existing accelerators to enable those accelerators to be used for low energy implantation.

Figure 8:
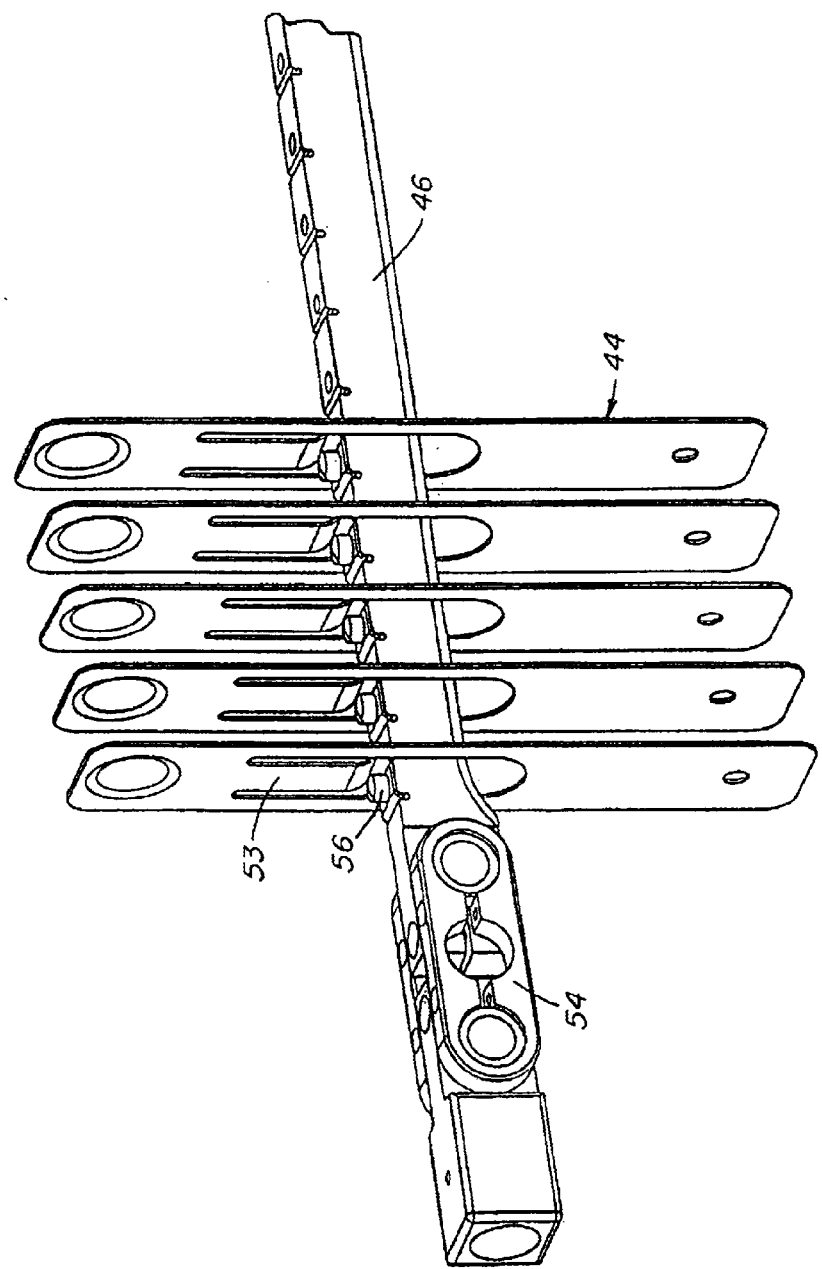
FIG. 8 is a perspective view of an actuation rod and switching elements according to an embodiment of the invention.

FIG. 8 illustrates one implementation of actuation rod 46, a linking mechanism 54 and flexible conductors 44. As shown in FIG. 8, each flexible conductor 44 is provided with a tab 53. The tab 53 is bent and is provided with an aperture to allow it to be secured to the actuation rod 46 by a suitable fastener, such as a screw 56. The invention is not limited in this regard, however, as any suitable method of connecting the flexible conductors 44 to the actuation rod 46 may be used. For example, in FIGS. 2–7, the flexible conductors 44 are secured to the actuation rod 46 around opening 49 by pegs 58 that bear against each side of the flexible conductors 44 and are attached to actuation rod 46. While two pegs 58 are disclosed in this embodiment, a single peg 58 may be used if each flexible conductor 44 is resiliently biased against the acceleration electrode 34, 38 or terminal 36 to which it is attached. In another embodiment (not shown), the actuation rod 46 is formed with grooves on opposing edges and passes through keyhole-shaped openings in the flexible conductors 44. This configuration allows the actuation rod 46 to remain on a fixed axis while moving the flexible conductors 44. In the described embodiments, the actuation rod 46 may be formed of delrin or another insulating material.

The actuation rod 46 may be connected to actuator 47 (FIG. 3) by a linking mechanism 54. The particular configuration of the linking mechanism 54 depends on the type of actuator and may enable different actuators to be used with a standard actuation rod. Exemplary actuators include, but are not limited to, pneumatic or hydraulic cylinders, electric solenoids, and other commonly available electromechanical actuators. In one embodiment, the actuator 47 is located outside the pressure vessel 45 (FIG. 2) which contains the accelerator electrodes 34, 38, and terminal 36, and a suitable feed-through device is used. Exemplary feed-through devices include bellows and sleeves, although any conventional feed-through device capable of enabling mechanical motion to be transmitted from a region of a first pressure to a region of a second pressure may be used. The particular feed-through device may be selected based on the particular range of pressures involved, as well as the required travel of the actuation rod.

In this embodiment, an actuation rod end journal, typically formed of metal, passes through a flange into a differential seal housing with a support bearing on the atmosphere side of the pressure vessel. The actuation rod is supported in a bearing inside the pressure vessel at the terminal location. Numerous other methods for actuation are available, and the invention is not limited to any particular method or device for moving the actuation rod.

A technique for testing the switching assembly is described with reference to FIG. 2. As shown in FIG. 2, each accelerator electrode 34, 38 and terminal 36 is connected to an adjacent accelerator electrode 34, 38 or terminal 36 by resistor 42. In the illustrated embodiment the resistors 42 are 110 megaohm resistors. Thus, resistors 42 are connected in series between a high energy divider (HED) terminal 59 and low energy divider (LED) terminal 60. Optional circuitry, such as light emitting diodes, etc., may be provided to indicate to an operator when the circuit is enabled. The resistors 42 may be shorted by switching elements 70 to cause the potential of each accelerator electrode to approximate the reference potential by actuation of the switching assembly as discussed above in connection with FIGS. 1–8. In the embodiment of FIG. 2, the reference potential is ground.

The operation of the switching assembly requires closure of each of switching elements 70a–70i, which corresponds to electrical contact between the flexible conductors 44 and each accelerator electrode 34, 38 or plate 50, in the low energy mode. This operation may be tested in one of several ways. In one embodiment, as shown in FIG. 2, a DC test signal may be input through a high voltage diode 63, and the DC current of the test signal is measured. The DC current is indicative of proper operation of the switching assembly. That is, one current value is measured when all of switching elements 70a–70i are closed and make electrical contact with the accelerator electrodes, and a different current value is measured when one or more of switching elements 70a–70i are open. Alternatively, a pulse test signal may be input through a high voltage capacitor, and the reflected signal is monitored to determine the quality of the series connection through switching elements 70a–70i. When a pulse test signal is used, diode 63 may be replaced with a high voltage capacitor. A comparison between the expected signal and the received signal provides an indication of the operation of the switching assembly. A suitable alarm or indication may be provided in the event the switching assembly fails to operate properly.

Figure 9:
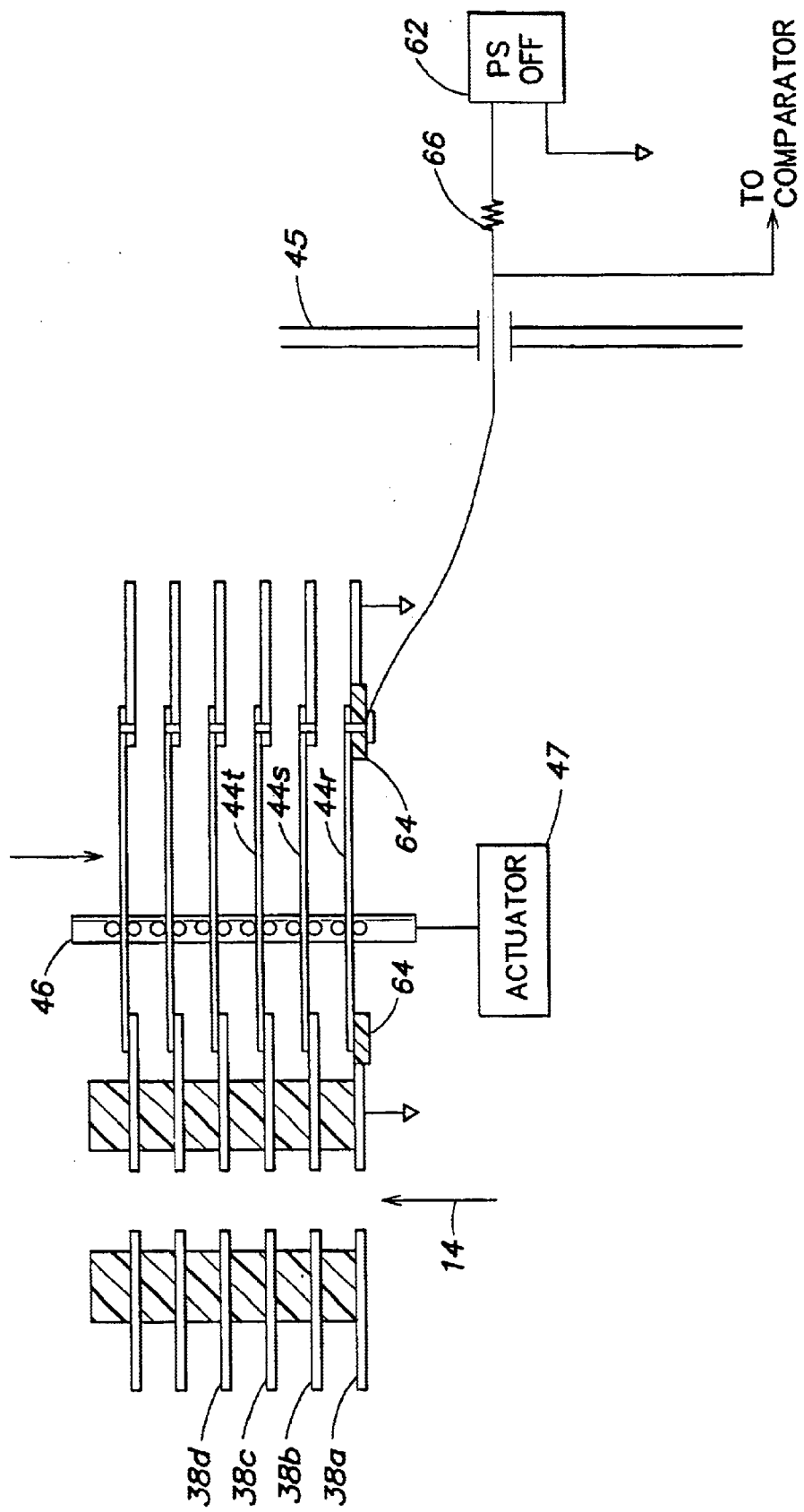
FIG. 9 is a partial cross-sectional side view of an accelerator, illustrating a third embodiment of the switching assembly, with switching elements in contact with respective accelerator electrodes in the high energy mode.
Figure 10:
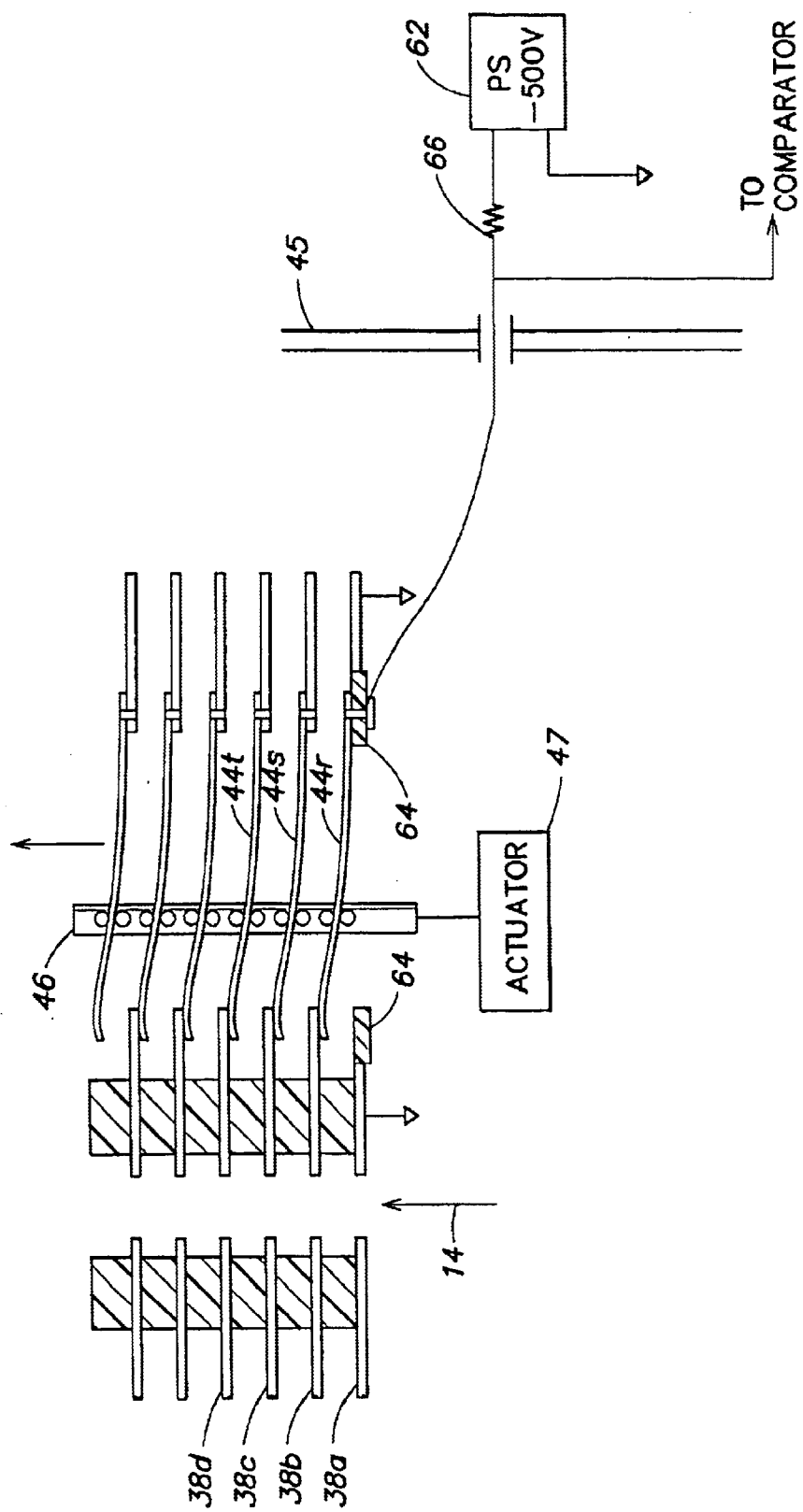
FIG. 10 is a partial cross-sectional side view of the accelerator of FIG. 9, with switching elements in contact with adjacent accelerator electrodes in the low energy mode.
Figure 11:
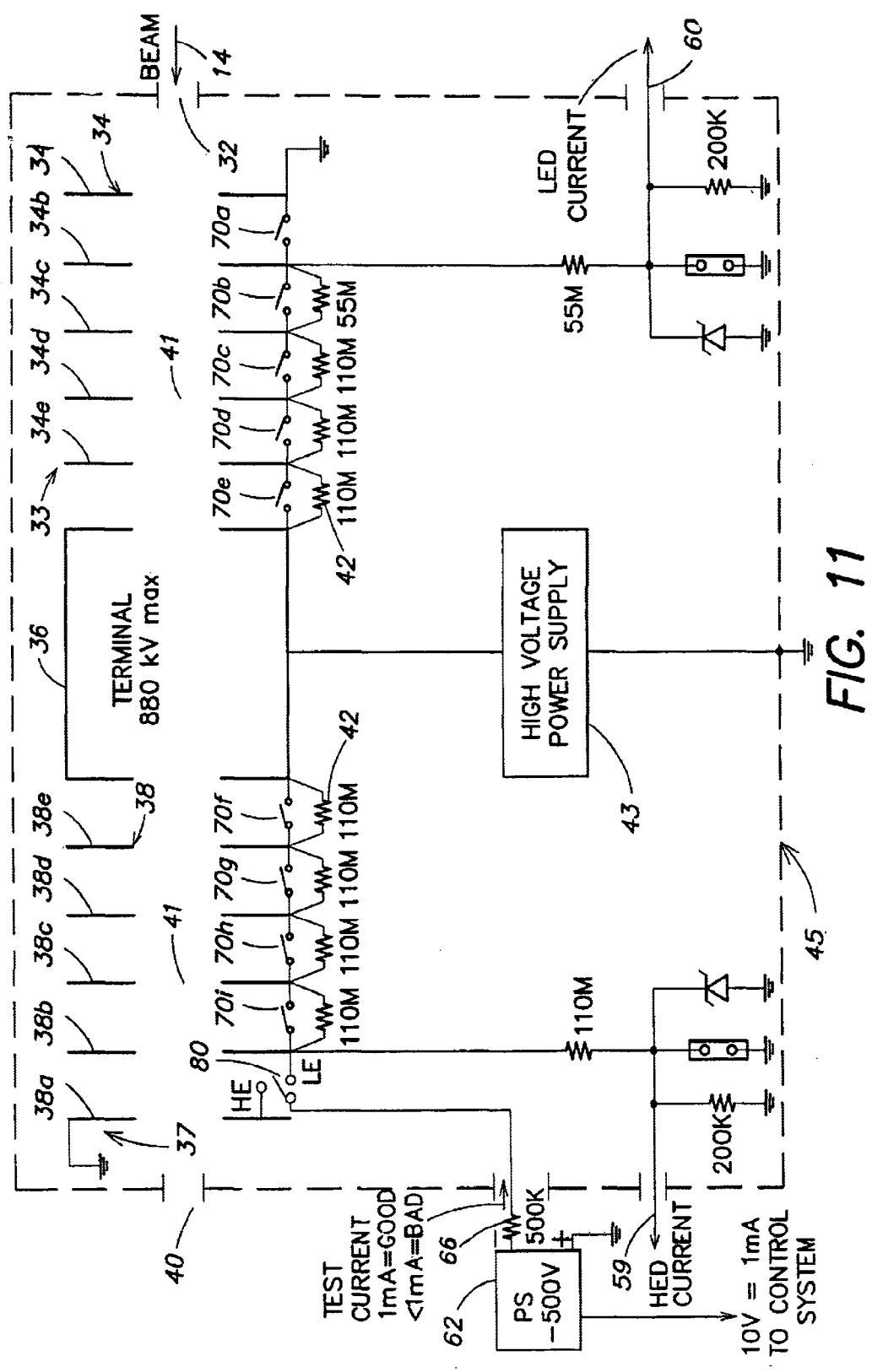
FIG. 11 is a schematic diagram of a tandem accelerator incorporating the switching assembly of FIGS. 9 and 10.

Another embodiment of the present invention is illustrated in FIGS. 9–11. FIGS. 9 and 10 are oriented so that the ion beam 14 enters the illustrated portion of the accelerator from the bottom and exits at the top. This embodiment enables a negative current to be applied to the switching elements in the low energy mode.

Specifically, as shown in FIGS. 9 and 10, a negative power supply 62 is connected through a resistor 66 to a first flexible conductor 44r that is electrically isolated from its respective acceleration electrode 38a by an insulating block 64. Upon activation of the switching assembly in the low energy mode, the actuation rod 46 moves flexible conductors 44r, 44s, 44t, etc. to engage adjacent accelerator electrodes 38b, 38c 38d, etc., respectively. Subsequently or simultaneously, the power supply 62 is energized to cause a negative current to flow through the flexible conductors 44.

In the illustrated embodiment, a negative potential, for example –500 volts, is applied to the series circuit of resistor 66, which may be 500 K ohms, and the flexible conductors 44. The negative current supplied through resistor 66 and flexible conductors 44 is selected to be sufficient to overcome any contact resistance between the flexible conductors 44 and the accelerator electrodes 34, 38 or terminal 36. Additionally, application of a negative current is advantageous in that any potentials which might be induced on the accelerator electrodes would be negative and would inhibit electrons from leaving the beam. Although a negative potential of –500 volts and a series resistor of 500 K ohms are described, the invention is not limited in this regard, and any suitable negative potential and series resistor may be utilized. Preferably, the negative potential is in a range between about –250 and –1000 volts and the resulting current is in a range of about 1 to 5 milliamps.

FIG. 11 schematically illustrates an accelerator configured for application of a negative current in the low energy mode. Like elements in FIGS. 2 and 11 have the same reference numerals. The negative power supply 62 is connected through resistor 66 to a switching element 80, which corresponds to flexible conductor 44r in FIGS. 9 and 10. In the low energy mode, switching elements 70a–70i are closed and switching element 80 is in the LE position. This causes accelerator electrodes 34, 38 and terminal 36 to be connected to ground and a negative current to flow through switching elements 70a–70i and 80. In the high energy mode, switching elements 70a–70i are open, switching element 80 is in the HE position and power supply 62 is deenergized, thus permitting high voltages to be applied to accelerator electrodes 34, 38 and terminal 36.

Proper functioning of the switching assembly may be verified by measuring the current delivered by negative power supply 62. In the example where power supply 62 has an output of –500 volts and resistor 66 has a value of 500 K ohms, a power supply current of 1 milliamp indicates proper functioning of switching elements 70a–70i and 80. By contrast, a power supply current less than 1 milliamp indicates a malfunction of one or more of the switching elements.

In each of the above-described embodiments, the flexible conductors 44 may be configured as flat, conductive strips. Since the conductive strips are used in a high voltage environment, the conductive strips preferably have rounded edges and are formed without sharp corners to minimize the possibility of a corona discharge.

Figure 12:
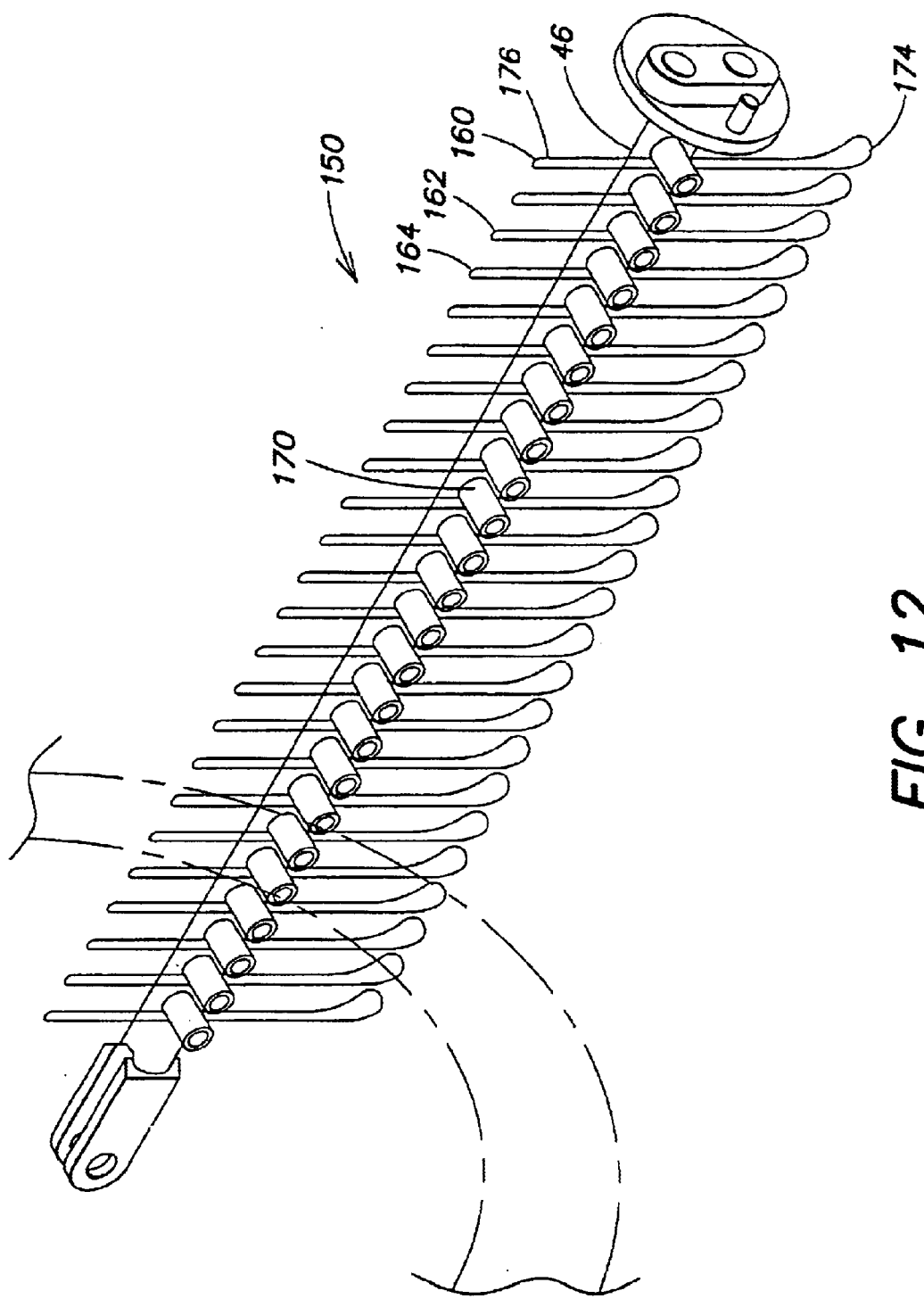
FIG. 12 is a perspective view of a switching assembly and a single accelerator electrode in accordance with a fourth embodiment of the invention.

In a fourth embodiment of the switching assembly, flexible conductors 44 are fabricated of wire. Referring to FIG. 12, a switching assembly 150 includes flexible conductors in the form of elongated wire loops 160, 162, 164, etc., actuation rod 46 and an actuator (not shown). Each wire loop 160, 162, 164, etc. may be attached to actuation rod 46 by an insulating spacer 170. Each wire loop is attached at or near one end 174 to one of the accelerator electrodes and is free to move at the other end 176 between the same accelerator electrode in high energy mode and an adjacent accelerator electrode in the low energy mode. The wire loops 160, 162, 164, etc. operate in the same manner as flexible conductors 44a, 44b, 44c, etc. shown in FIGS. 3 and 4 and described above.

The wire loops 160, 162, 164, etc. have the advantage of no sharp edges, because of the rounded cross-section of the wire. The wire loops are formed so as to avoid sharp bends which would increase the risk of arc discharge. In one embodiment, wire loops 160, 162, 164, etc. are fabricated of beryllium copper wire having a diameter of 0.035 inch.

In the above description, a single flexible conductor 44 is connected to each accelerator electrode 34, 38. The invention is not limited in this regard, however, as any number of flexible conductors 44 may be provided for each accelerator electrode 34, 38. Thus, redundancy may be provided by using multiple flexible conductors 44 or multiple contact points on each flexible conductor 44.

Figure 13:
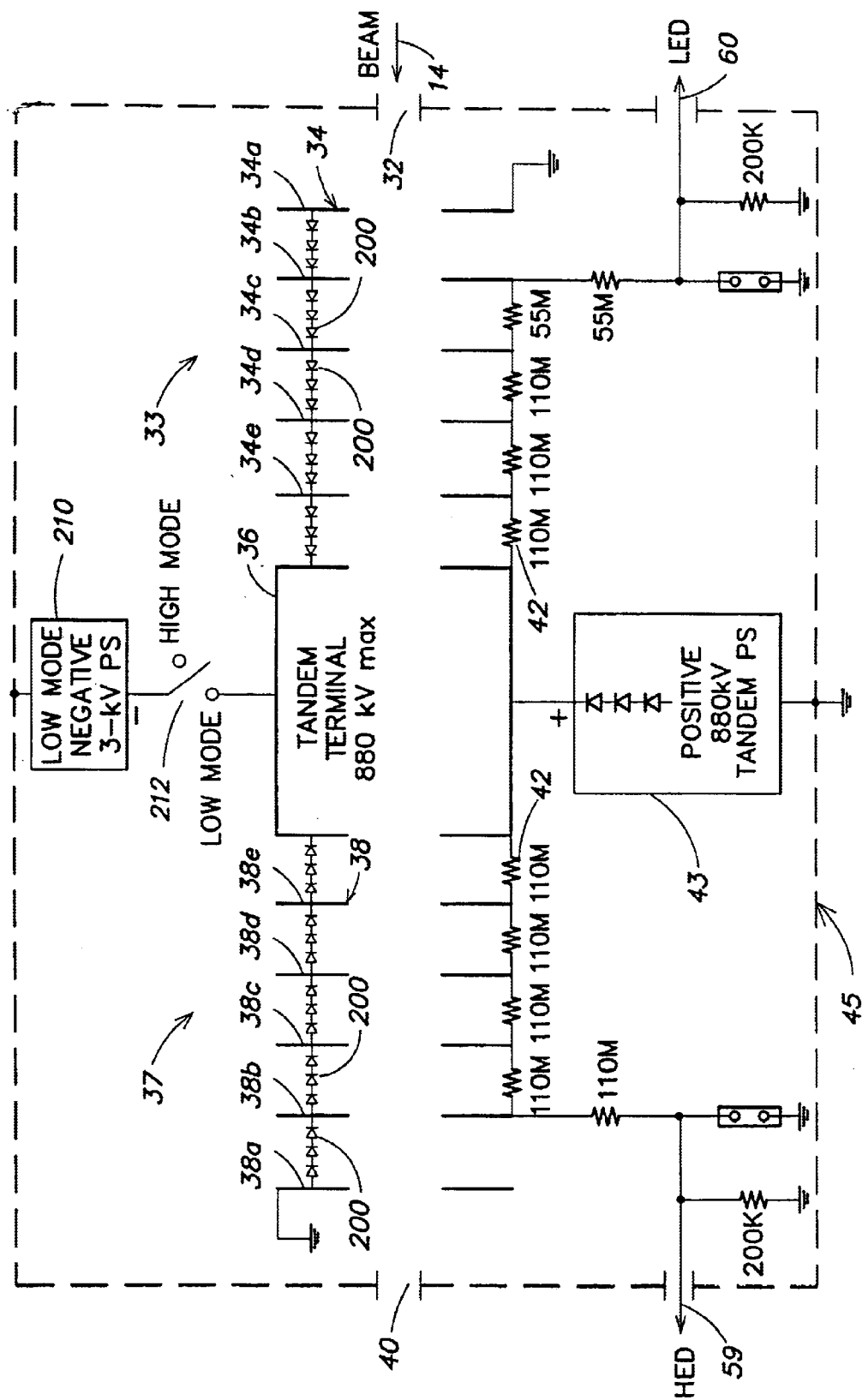
FIG. 13 is a schematic diagram of a tandem accelerator incorporating a switching assembly in accordance with a fifth embodiment of the invention.

The embodiments of the switching assembly described above have utilized mechanical switching elements. A schematic diagram of a tandem accelerator incorporating a fifth embodiment of the switching assembly is shown in FIG. 13. Like elements in FIGS. 2 and 13 have the same reference numerals. In the embodiment of FIG. 13, the switching elements are implemented as diodes connected between adjacent accelerator electrodes. Thus, for example, three diodes 200 are connected in series between accelerator electrodes 38a and 38b. The polarity of the diodes 200 is such that the diodes are reverse biased in the high energy mode and are forward biased in the low energy mode.

Although three diodes in series are utilized between adjacent accelerator electrodes in the embodiment of FIG. 13, it will be understood that one or more diodes may be connected between adjacent accelerator electrodes, depending on the reverse voltage rating of the diodes and the required operating voltage between accelerator electrodes in the high energy mode.

In the embodiment of FIG. 13, a diode power supply 210 is connected through a mode switch 212 to terminal 36. The power supply 210 has the opposite polarity from high voltage power supply 43. Thus, where high voltage power supply 43 is positive, power supply 210 is negative. The voltage of power supply 210 is sufficient to place all diodes 200 in a conducting state in the low energy mode. The voltage of power supply 210 must be sufficient to overcome the forward voltage drop of the high voltage diodes 200 connected in series. Preferably, supply 210 operates in a constant current mode to maintain a current of a few milliamps through diodes 200. In a preferred embodiment, power supply 210 is −3 kV. Switch 212 connects power supply 210 to terminal 36 in the low energy mode. Switch 212 and power supply 210 constitute an actuator for the switching assembly which uses diodes as switching elements.

In the high energy mode, high voltage power supply 43 is energized and switch 212 disconnects power supply 210 from terminal 36. The high voltage power supply reverse biases the diodes 200 connected between adjacent accelerator electrodes. Thus, the accelerator operates in the high energy mode and the accelerator electrodes (except electrodes 34a and 38a) are electrically isolated from the reference potential. In the low energy mode, high voltage power supply 43 is turned off or otherwise disabled from applying a high voltage to terminal 36. Switch 212 is closed, and power supply 210 is connected to terminal 36. The negative power supply 210 causes diodes 200 to conduct, thereby effectively connecting accelerator electrodes 34 and 38 to the reference potential.

Figure 14:
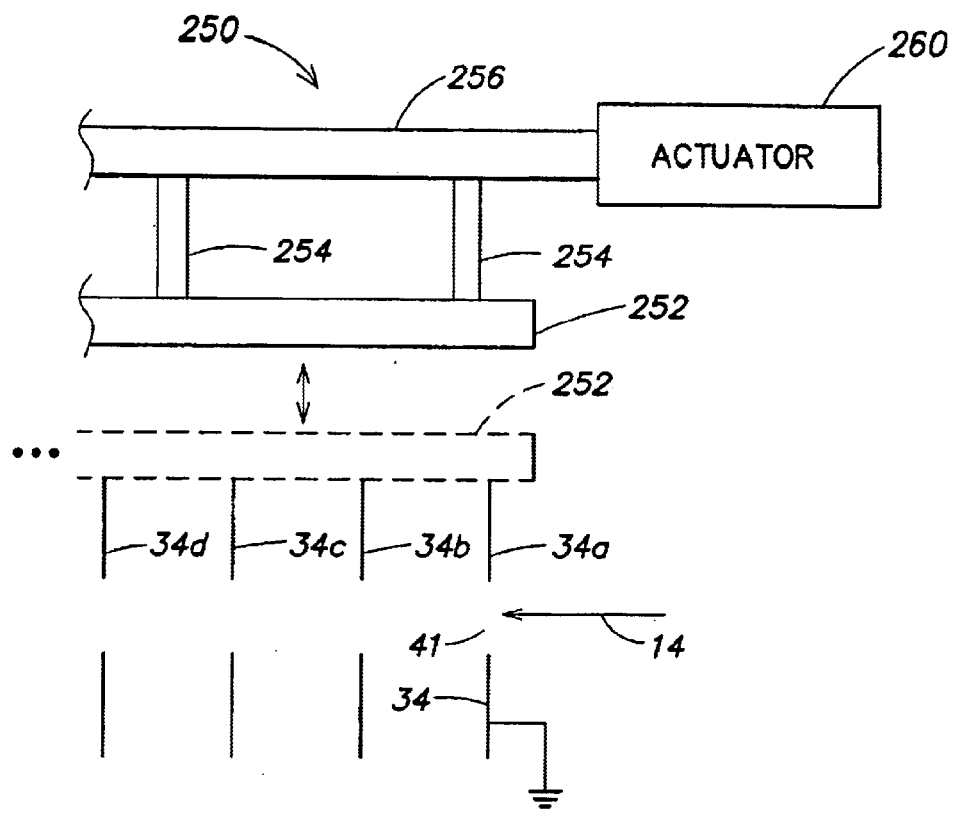
FIG. 14 is a partial schematic diagram of a tandem accelerator incorporating a sixth embodiment of the invention.
Figure 15:
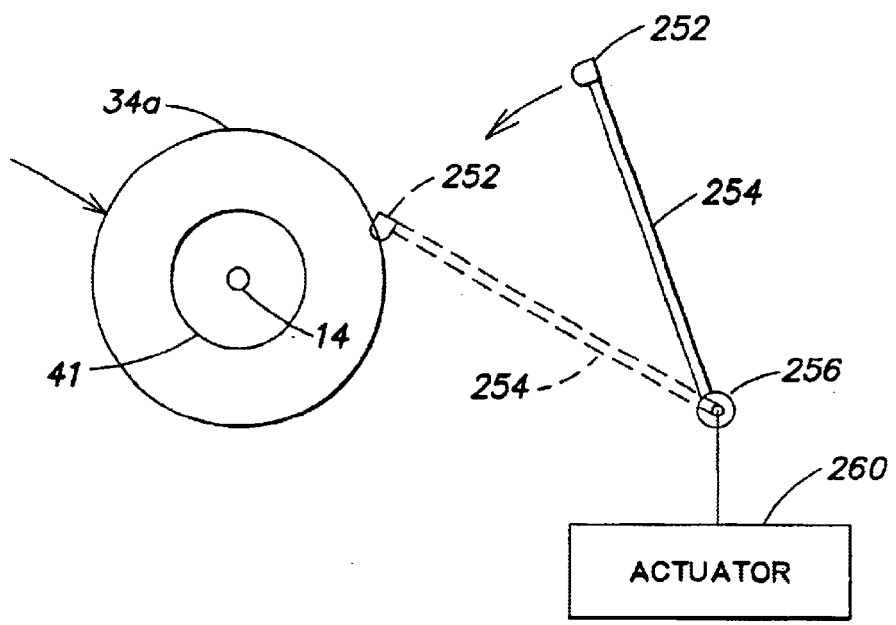
FIG. 15 is a schematic diagram of the sixth embodiment of the invention as viewed along the beam axis.

Partial schematic diagrams of a tandem accelerator incorporating a sixth embodiment of the switching assembly are shown in FIGS. 14 and 15. Like elements in FIGS. 2, 14 and 15 have the same reference numerals. In the embodiment of FIGS. 14 and 15, a switching assembly 250 includes a switching bar 252, support arms 254, an actuation rod 256 and an actuator 260. Switching bar 252 is laterally movable between a high energy position spaced from accelerator electrodes 34 and 38, and a low energy position in contact with the edges of accelerator electrodes 34 and 38. The high energy position is illustrated with solid lines in FIGS. 14 and 15, and the low energy position is illustrated in phantom in FIGS. 14 and 15.

The switching bar 252 is mounted to actuation rod 256 by support arms 254. The actuator 260 is coupled to actuation rod 256 and causes actuation rod 256 to rotate and to thereby move switching bar 252 between the high energy position and the low energy position. Switching bar 252 may be conductive. Thus, when switching bar 252 is in the low energy position contacting accelerator electrodes 34 and 38, the accelerator electrodes 34 and 38 are connected to a reference potential such as ground. In the example of FIG. 14, the electrodes are connected through accelerator electrode 34a to ground.

The switching bar 252 preferably includes one or more resilient conductors to ensure electrical contact with each of the accelerator electrodes 34 and 38, despite variations in the sizes and positions of the accelerator electrodes. In one embodiment, the switching bar 252 includes resilient conductive fingers for contacting accelerator electrodes 34 and 38. In another embodiment, the switching bar 252 includes foam or other resilient material covered with a conductive cloth.

Although the present invention has been described in connection with an ion beam accelerator that is capable of providing both high energy and low energy beams, the invention is not limited in that regard and applies to any charged particle accelerator requiring simultaneous connection of multiple accelerator electrodes to a reference potential.

It should be understood that various changes and modifications of the embodiments shown in the drawings described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A charged particle accelerator that is operable in a high energy mode and in a low energy mode, comprising:

a high voltage power supply for generating a high voltage;

an accelerator column coupled said high voltage power supply, said accelerator column comprising a plurality of accelerator electrodes having apertures for transport of a charged particle beam and resistors coupled between adjacent ones of said accelerator electrodes for distributing said high voltage among said accelerator electrodes, wherein said high voltage power supply is disabled from energizing said accelerator column in the low energy mode; and a switching assembly comprising one or more switching elements for electrically connecting said accelerator electrodes to a reference potential in the low energy mode and for electrically isolating said accelerator electrodes from the reference potential in the high energy mode.

2. A charged particle accelerator as defined in claim 1 wherein each of said switching elements comprises a flexible conductor having a first portion affixed to one of said accelerator electrodes and a second portion that is movable between a high energy position in electrical contact with said one of said accelerator electrodes and a low energy position in electrical contact with an adjacent accelerator electrode.

3. A charged particle accelerator as defined in claim 2 wherein said switching assembly further comprises an actuator for moving said flexible conductors between the high energy position and the low energy position, and an actuation rod coupled between said actuator and each of said flexible conductors.

4. A charged particle accelerator as defined in claim 2 wherein said flexible conductors comprise conductive strips.

5. A charged particle accelerator as defined in claim 2 wherein said flexible conductors comprise conductive wires form into elongated loops.

6. A charged particle accelerator as defined in claim 1 wherein said switching elements are respectively connected directly to said accelerator electrodes.

7. A charged particle accelerator as defined in claim 1 wherein said switching assembly comprises a stack of electrically isolated conductive plates respectively connected to said accelerator electrodes and wherein each of said switching elements comprises a flexible conductor having a first portion affixed to one of said conductive plates and a second portion that is movable between a high energy position in electrical contact with said one of said conductive plates and a low energy position in electrical contact with an adjacent conductive plate.

8. A charged particle accelerator as defined in claim 7 wherein said switching assembly further comprises an actuator for moving said flexible conductors between the high energy position and the low energy position, and an actuation rod coupled between said actuator and said flexible conductors.

9. A charged particle accelerator as defined in claim 1 wherein said switching elements comprise diodes respectively coupled to said accelerator electrodes and wherein said diodes are reverse biased in the high energy mode and are forward biased to provide a conductive path to the reference potential in the low energy mode.

10. A charged particle accelerator as defined in claim 9 further comprising a diode power supply for forward biasing said diodes in the low energy mode.

11. A charged particle accelerator as defined in claim 1 wherein said reference potential is ground.

12. A charged particle accelerator as defined in claim 1 wherein said reference potential is a negative voltage.

13. A charged particle accelerator as defined in claim 1 wherein said switching elements connect said accelerator electrodes in series to the reference potential.

14. A charged particle accelerator as defined in claim 1 wherein said switching assembly includes means for moving said one or more switching elements into electrical contact with said accelerator electrodes in the low energy mode.

15. A charged particle accelerator as defined in claim 1 wherein said one or more switching elements comprise a conductive switching bar that is laterally movable between a low energy position in electrical contact with said accelerator electrodes and a high energy position spaced from said accelerator electrodes.

16. In a charged particle accelerator comprising a high voltage power supply for generating a high voltage and an accelerator column coupled to said high voltage power supply, said accelerator column comprising a plurality of accelerator electrodes having apertures for transport of a charged particle beam and resistors coupled between adjacent ones of said accelerator electrodes for distributing said high voltage among said accelerator electrodes, a method for operating said charged particle accelerator in a low energy mode, comprising the steps of:
  disabling said high voltage power supply from energizing said accelerator column in the low energy mode; and
  electrically connecting said accelerator electrodes to a reference potential in the low energy mode.

17. A method as defined in claim 16 wherein the step of electrically connecting said accelerator electrodes to a reference potential comprises electrically connecting said accelerator electrodes in series with movable switching elements coupled between adjacent ones of said accelerator electrodes.

18. A method as defined in claim 16 wherein the step of electrically connecting said accelerator electrodes to a reference potential comprises forward biasing diodes coupled to each of said accelerator electrodes to provide a conductive path to the reference potential.

19. A method as defined in claim 16 wherein the step of electrically connecting said accelerator electrodes to a reference potential comprises electrically connecting said accelerator electrodes to ground.

20. A method as defined in claim 16 wherein the step of electrically connecting said accelerator electrodes to a reference potential comprises electrically connecting said accelerator electrodes to a negative voltage.

21. A method as defined in claim 16 wherein the step of electrically connecting said accelerator electrodes to a reference potential comprises laterally moving a conductive switching bar into electrical contact with said accelerator electrodes.

22. A charged particle accelerator that is operable in a high energy mode and in a low energy mode, comprising:
  a high voltage power supply for generating high voltage;
  an accelerator column coupled to said high voltage power supply, said accelerator column comprising a plurality of accelerator electrodes having apertures for transport of a charged particle beam and resistors coupled between adjacent ones of said accelerator electrodes for distributing said high voltage among said accelerator electrodes, wherein said high voltage power supply is disabled from energizing said accelerator column in the low energy mode; and
  a switching assembly comprising one or more switching elements that are mechanically movable between a high energy position wherein said accelerator electrodes are electrically isolated by said switching elements and a low energy position wherein said accelerator electrodes are electrically connected by said switching elements to a reference potential.

23. A charged particle accelerator as defined in claim 22 wherein each of said switching elements comprises a flexible conductor having a first portion affixed to one of said accelerator electrodes and a second portion that is movable between a high energy position in electrical contact with said one of said accelerator electrodes and a low energy position in electrical contact with an adjacent accelerator electrode.

24. A charged particle accelerator as defined in claim 22 wherein said switching assembly further comprises an actuator for moving said flexible conductors between the high energy position and the low energy position, and an actuation rod coupled between said actuator and each of said flexible conductors.

25. A charged particle accelerator as defined in claim 24 wherein said flexible conductors are respectively connected directly to said accelerator electrodes.

26. A charged particle accelerator as defined in claim 22 wherein said switching assembly comprises a stack of electrically isolated conductive plates respectively connected to said accelerator electrodes and wherein each of said switching elements comprises a flexible conductor having a first portion affixed to one of said conductive plates and a second portion that is movable between a high energy position in electrical contact with said one of said conductive plates and a low energy position in electrical contact with an adjacent conductive plate.

27. A charged particle accelerator as defined in claim 22 wherein said reference potential is ground.

28. A charged particle accelerator as defined in claim 22 wherein said one or more switching elements comprise a conductive switching bar that is laterally movable between a low energy position in electrical contact with said accelerator electrodes and a high energy position spaced from said accelerator electrodes.

29. A charged particle accelerator that is operable in a high energy mode and in a low energy mode, comprising:
  a high voltage power supply for generating a high voltage;
  an accelerator column coupled to said high voltage power supply, said accelerator column comprising a plurality of accelerator electrodes having apertures for transport of a charged particle beam and resistors coupled between adjacent ones of said accelerator electrodes for distributing said high voltage among said accelerator electrodes, wherein said high voltage power supply is disabled from energizing said accelerator column in the low energy mode; and a switching assembly comprising diodes respectively coupled to each of said accelerator electrodes, wherein said diodes are reversed biased and electrically isolate said accelerator electrodes in the high energy mode and are forward biased and electrically connect said accelerator electrodes to a reference potential in the low energy mode.

30. A charged particle accelerator as defined in claim 29 wherein said reference potential is ground.

31. A charged particle accelerator as defined in claim 29 wherein said switching assembly further comprises a diode power supply for forward biasing said diodes in the low energy mode.

* * * * *